(12) United States Patent
Jang et al.

(10) Patent No.: US 8,487,331 B2
(45) Date of Patent: Jul. 16, 2013

(54) LIQUID CRYSTAL DISPLAY DEVICE INCLUDING WHITE LIGHT EMITTING DIODE

(75) Inventors: Eun-Joo Jang, Suwon-si (KR); Young-Hwan Kim, Seongnam-si (KR); Shin-Ae Jun, Seongnam-si (KR); Hyo-Sook Jang, Yongin-si (KP); Seok-Hwan Hong, Seoul (KR); Soo-Kyung Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 127 days.

(21) Appl. No.: 12/969,935

(22) Filed: Dec. 16, 2010

(65) Prior Publication Data
US 2011/0241044 A1   Oct. 6, 2011

(30) Foreign Application Priority Data
Mar. 31, 2010   (KR) .................. 10-2010-0029560

(51) Int. Cl.
*H01L 33/00* (2010.01)
(52) U.S. Cl.
USPC .............................................. 257/98; 438/30
(58) Field of Classification Search
USPC .................... 438/22, 29, 30; 257/98
See application file for complete search history.

(56) References Cited

U.S. PATENT DOCUMENTS

| 7,083,490 | B2 | 8/2006 | Mueller et al. |
| 7,102,152 | B2 | 9/2006 | Chua et al. |
| 7,481,562 | B2 | 1/2009 | Chua et al. |
| 7,535,029 | B2 | 5/2009 | Smith et al. |
| 2007/0085092 | A1 | 4/2007 | Chen |
| 2008/0012031 | A1* | 1/2008 | Jang et al. .................. 257/89 |
| 2008/0230795 | A1 | 9/2008 | Dias |
| 2008/0246017 | A1 | 10/2008 | Gillies et al. |
| 2009/0009057 | A1 | 1/2009 | Lee et al. |
| 2009/0109435 | A1 | 4/2009 | Kahen et al. |
| 2009/0180055 | A1 | 7/2009 | Kim et al. |
| 2010/0141118 | A1 | 6/2010 | Bawendi et al. |

FOREIGN PATENT DOCUMENTS

| JP | 2006114900 A | 4/2006 |
| JP | 2006513458 A | 4/2006 |
| JP | 2008235893 A | 10/2008 |
| KR | 1020040073068 A | 8/2004 |
| KR | 1020080006906 A | 1/2008 |
| KR | 100835059 B1 | 5/2008 |
| KR | 1020090078547 A | 7/2009 |
| WO | 2005017951 A2 | 2/2005 |

* cited by examiner

Primary Examiner — Bradley K Smith
(74) Attorney, Agent, or Firm — Cantor Colburn LLP

(57) ABSTRACT

A white light emitting diode and a liquid crystal display device that realizes images using the white light are provided. The white light emitting diode includes a blue light emitting diode ("LED") light source, and a light conversion layer which converts incident light from the LED light source into white light. The light conversion layer includes green light emitting semiconductor nanocrystal and red light emitting semiconductor nanocrystal. A light emitting peak wavelength of the green light emitting semiconductor nanocrystal is about 520 nanometer (nm) or more, a light emitting peak wavelength of the red semiconductor nanocrystal is about 610 nanometer (nm) or more, and full width at half maximums (FWHMs) of light emitting peaks of the green and red light emitting semiconductor nanocrystals are about 45 nanometer (nm) or less.

22 Claims, 11 Drawing Sheets

LIQUID CRYSTAL DISPLAY DEVICE INCLUDING WHITE LIGHT EMITTING DIODE

CROSS-REFERENCE TO RELATED APPLICATIONS

This application claims priority to Korean Patent Application No. 10-2010-0029560 filed on Mar. 31, 2010, and all the benefits accruing therefrom under 35 U.S.C. §119, the entire content of which is incorporated herein by reference.

BACKGROUND

1. Field

Provided is a liquid crystal display device including a white light emitting diode.

2. Description of the Related Art

A white light emitting diode ("LED") using a semiconductor is in the spotlight as one of the next generation light emitting devices that is capable of replacing existing light emitting devices, due to its long life-span, capability of being down-sized, low power consumption, and environmentally friendly characteristic of being mercury free. The white light emitting diode is also used for an instrument panel of automobiles, a backlight of liquid crystal displays ("LCDs"), and the like.

Particularly, for use as a backlight of a liquid crystal display, a method of using a tri-color (e.g., red, green, and blue) light emitting diode having excellent efficiency and color purity has been suggested. However using the tri-color (e.g., red, green, and blue) light emitting diode has a drawback of low price competitiveness due to its high manufacturing cost and complicated operation circuit. Thus, there is a demand for the development of a one-chip solution that can reduce manufacture cost and simplify the construction of a device, while maintaining efficiency and color purity performance similar to the existing method.

As one of the one-chip solutions, a white LED that combines an indium gallium nitride (InGaN) series blue light emitting diode having a wavelength of about 450 nanometer (nm) with a cerium-doped yttrium aluminum garnet ("YAG:Ce") phosphor has been developed. The operation principle of the light emitting diode is that a portion of blue light generated in the blue light emitting diode excites the YAG:Ce phosphor to generate a yellow-green color, and the blue and the yellow-green colors are composed to emit white light.

However, since the white LED light combining the blue light emitting diode with the YAG:Ce phosphor includes only a portion of the spectrum of the visible ray region, the white LED light has a low color rendering index. Consequently, when passing through a red, green and blue color filter, many portions of the white LED light fail to pass through the color filter thus causing efficiency loss. Thereby, the white LED light passing through the red, green and blue color filter has low color purity, and thus is not suitable for a display device requiring high definition such as a television ("TV").

Recently, a method of manufacturing a white light emitting diode using an ultraviolet ("UV") light emitting diode, that is expected to have high energy efficiency as an excitation source rather than a blue light emitting diode, and using a blue, green, and red light emitting source, has been researched. However, it is currently required to develop a red light emitting source having high efficiency compared to blue and green.

As another method, a method of coating green and red inorganic phosphors on a blue light emitting diode has been attempted. However, a suitable material that is capable of exciting an inorganic phosphor that is excited by relatively high energy to a blue wavelength of the visible light region, has not yet been developed, and a thus-far developed green phosphor has low stability and color purity. Further, a problem of low efficiency of a red phosphor has not yet been settled, and thus the method of coating green and red inorganic phosphors on a blue light emitting diode has a limitation in that color purity and light efficiency required in a light emitting diode for a backlight unit cannot be secured.

SUMMARY

Provided is a liquid crystal display ("LCD") device including a white light emitting diode ("LED") that can stably maintain white light, while exhibiting high color reproducibility and luminous efficiency.

Provided is a liquid crystal display device including a white light emitting diode and a color filter that realizes an image using white light. The white light emitting diode includes a blue LED light source, and a light conversion layer that converts the incident light from the LED light source into white light. The light conversion layer includes green light emitting semiconductor nanocrystal and red light emitting semiconductor nanocrystal. A light emitting peak wavelength of the green light emitting semiconductor nanocrystal is about 520 nanometer (nm) or more, a light emitting peak wavelength of the red semiconductor nanocrystal is about 610 nm or more, and FWHMs (full width at half maximum) of light emitting peaks of the green and red light emitting semiconductor nanocrystals are about 45 nm or less. Further, a green color filter transmission rate of the light emitting spectrum of the green light emitting semiconductor nanocrystal is about 90% or more, and a red color filter transmission rate of the light emitting spectrum of the green light emitting semiconductor nanocrystal is less than about 10%. A red color filter transmission rate of the light emitting spectrum of the red light emitting semiconductor nanocrystal is about 90% or more, and a green color filter transmission rate of the light emitting spectrum of the red light emitting semiconductor nanocrystal is less than about 10%.

Provided is a white light emitting diode including a blue LED light source, and a light conversion layer that converts the incident light from the LED light source into white light. A light emitting peak wavelength of the green light emitting semiconductor nanocrystal is about 520 nm or more, a light emitting peak wavelength of the red semiconductor nanocrystal is about 610 nm or more, FWHMs (full width at half maximum) of light emitting peaks of the green and red light emitting semiconductor nanocrystals are about 45 nm or less, and the white light emitting diode has color reproducibility of about 90% or more, and in one embodiment 100% or more, compared to National Television System Committee ("NTSC") color coordinate of International Commission on Illumination ("CIE") 1931 coordinates.

A ratio of an overlapping area (S) to a total area ($A_G$) of the light emitting spectrum of the green light emitting semiconductor nanocrystal ($S/(A_G)$, and a ratio of an overlapping area (S) to a total area ($A_R$) of the light emitting spectrum of the red light emitting semiconductor nanocrystal ($S/A_R$) may be about 10% or less, or for example, about 7% or less.

FWHMs (full width at half maximum) of light emitting peaks of the green and red light emitting semiconductor nanocrystals may be about 45 nm or less.

The light emitting peak wavelength of the blue LED light source may be about 440 nm to about 470 nm, the light emitting peak wavelength of the green light emitting semiconductor nanocrystal may be about 520 nm to about 550 nm, and the light emitting peak wavelength of the red light emitting semiconductor nanocrystal may be about 620 nm to about 640 nm.

The blue LED light source may have a relative light emitting intensity of about 0.43±0.05, the green light emitting semiconductor nanocrystal may have a relative light emitting intensity of about 0.27±0.05, and the red light emitting semiconductor nanocrystal may have a relative light emitting intensity of about 0.28±0.05.

The white light emitting diode may have color coordinates including an x-coordinate of about 0.24±0.05, and a y-coordinate of about 0.21±0.05. The color temperature of the white light emitting diode may be about 4000 Kelvin (K) to about 100,000 Kelvin (K).

A green color filter transmission rate of the light emitting spectrum of the green light emitting semiconductor nanocrystal may be about 95% or more compared to a maximum transmittance rate of a green color filter, and a red color filter transmission rate of the green light emitting semiconductor nanocrystal may be less than about 5% compared to a maximum transmittance rate of a red color filter. Further, a red color filter transmission rate of the light emitting spectrum of the red light emitting semiconductor nanocrystal may be about 95% or more compared to a maximum transmittance rate of a red color filter, and a green color filter transmission rate of the light emitting spectrum of the red light emitting semiconductor nanocrystal may be less than about 5% compared to a maximum transmittance rate of a green color filter.

Provided is a liquid crystal display device including the white light emitting diode, and a liquid crystal panel including a color filter that realizes images using the white light generated by the white light emitting diode.

The ratio of light emitting intensities of blue, green, and red light emitting spectra of the liquid crystal display device after color filter transmission may be in the range of about 1:0.9±0.1:0.8±0.1.

BRIEF DESCRIPTION OF THE DRAWINGS

The above and other features of this disclosure will become more apparent by describing in further detail embodiments thereof with reference to the accompanying drawings, in which.

DETAILED DESCRIPTION

Figure 1:
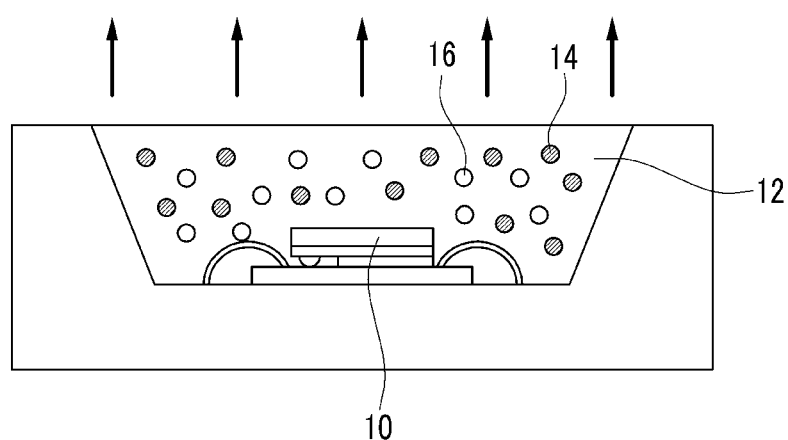
FIGS. 1 to 4 are cross-sectional views of embodiments of white light emitting diodes including a light conversion layer of various structures.

Embodiments will hereinafter be described in detail referring to the following accompanied drawings, and can be easily performed by those who have common knowledge in the related art. However, these embodiments are exemplary, and this disclosure is not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Hereinafter, an embodiment of a white light emitting diode ("LED"), according to the invention will be described in detail.

Provided is a white light emitting diode including a blue LED light source and a light conversion layer that converts incident light from the blue LED light source into white light. The light conversion layer includes a green light emitting semiconductor nanocrystal and a red light emitting semiconductor nanocrystal.

In the white light emitting diode, the green light emitting semiconductor nanocrystal and the red light emitting semiconductor nanocrystal are excited by the light emitted from the blue LED light source to emit green light and red light. The emitted green light and red light are combined with blue light that is transmitted through the light conversion layer, to realize the white light.

The light emitting peak wavelength of the blue LED light source may be about 440 nanometer (nm) to about 470 nanometer (nm), or for example, about 440 nm to about 460 nm. The light emitting peak wavelength of the green light emitting semiconductor nanocrystal may be about 520 nm or more, or for example, about 520 nm to about 550 nm. The light emitting peak wavelength of the red light emitting semiconductor nanocrystal may be about 610 nm or more, or for example, about 620 nm to about 640 nm.

Further, full width at half maximum's (FWHMs) of the light emitting peaks of the green and red light emitting semiconductor nanocrystals may be about 45 nm or less, or for example 40 nm or less. When the wavelength and FWHM are within the above ranges, a light emitting device having excellent color reproducibility and luminance can be provided.

Since in the color filter of a liquid crystal display device, each color region is widely distributed and overlapping parts thereof exist, blue color filter transmission may occur simultaneously with light emitting of a part of the green region, green color filter transmission may occur simultaneously with light emitting of a part of the blue and red regions, and/or red color filter transmission may simultaneously occur with light emitting of a part of the green region. Thereby, color coordinates that express each color when operating a color in a liquid crystal display device change to determine color reproducibility.

In a white light emitting diode using semiconductor nanocrystal as a light emitting source, that can be used as a backlight unit, by controlling each green color filter and red color filter transmission rate of the light emitting spectra of the green and red semiconductor nanocrystals of the white light emitting diode, high luminous efficiency and luminance and improved color reproducibility can be obtained.

According to one embodiment, a green color filter transmission rate of the light emitting spectrum of the green light emitting semiconductor nanocrystal may be about 90% or more, for one example, about 95% or more, or for another example, about 98% or more, of a maximum transmittance rate of a green color filter, and a red color filter transmission rate of the light emitting spectrum of the green light emitting semiconductor nanocrystal may be less than about 10%, or less than about 5% of a maximum transmittance rate of a red color filter. Further, a red color filter transmission rate of the light emitting spectrum of the red light emitting semiconductor nanocrystal may be about 90% or more, for one example, about 95% or more, or for another example about 98% or more of a maximum transmittance rate of a red color filter, and a green color filter transmission rate of the light emitting spectrum of the red light emitting semiconductor nanocrystal may be less than about 10%, or for example less than about 5% of a maximum transmittance rate of a green color filter. If the transmission rate is controlled within the above ranges, improved color reproducibility and luminance can be obtained. The maximum transmittance rate of a color filter means, supposing a transmittance rate at a wavelength showing maximum transmittance of the color filter transmittance spectrum as 100%, is a transmittance rate obtained through multiplying a light emitting intensity of the corresponding light source by the transmittance rate of the color filter.

According to another embodiment, provided is a white light emitting diode having color reproducibility of about 90% or more, and in one embodiment 100% or more, compared to an National Television System Committee ("NTSC") color coordinate of International Commission on Illumination ("CIE") 1931 coordinates.

A ratio of an overlapping area (S), to a total area ($A_G$) of the light emitting spectrum of the green light emitting semiconductor nanocrystal ($S/A_G$), and/or a ratio of an overlapping area (S), to a total area ($A_R$) of the light emitting spectrum of the red light emitting semiconductor nanocrystal ($S/A_R$), may be about 10% or less, or for example, about 7% or less. When the ratio of ($S/A_G$) and/or ($S/A_R$) is within the above range, a light emitting device having excellent color reproducibility and luminance can be provided.

In order to control the color coordinate of white light, the blue LED light source may have a relative light emitting intensity of about 0.43±0.05, the green light emitting semiconductor nanocrystal may have a relative light emitting intensity of about 0.27±0.05, and the red light emitting semiconductor nanocrystal may have a relative light emitting intensity of about 0.28±0.05. When the light emitting intensities are within the above ranges, white light having a wider range of color reproducibility can be realized.

The white light emitting diode may have color coordinates of an x-coordinate of about 0.24±0.05 and a y-coordinate of about 0.21±0.05, and a color temperature of about 4,000 Kelvin (K) to about 100,000 Kelvin (K), for example 9,500K to about 100,000K. When the color coordinate and color temperature are within the above ranges, white light having a wider range of color reproducibility can be realized and it may be used as a light source of a display to express various colors.

The semiconductor nanocrystal may include a Group II-VI compound, a Group III-V compound, a Group IV-VI compound, a Group IV compound, etc. The semiconductor nanocrystal particles may have a core/shell structure. The interface of the core and shell may have a concentration gradient structure with decreasing concentration of elements existing at the shell toward a center.

The Group II-VI compound may include a binary element compound selected from the group consisting of CdSe, CdTe, ZnS, ZnSe, ZnTe, ZnO MgSe, MgS, and a mixture thereof, a ternary element compound selected from the group consisting of CdSeS, CdSeTe, CdSTe, ZnSeS, ZnSeTe, ZnSTe, CdZnS, CdZnSe, CdZnTe, MgZnSe, MgZnS, and a mixture thereof, and a quaternary element compound selected from the group consisting of CdZnSeS, CdZnSeTe, CdZnSTe, and a mixture thereof.

The Group III-V compound may include a binary element compound selected from the group consisting of GaN, GaP, GaAs, GaSb, AlN, AlP, AlAs, AlSb, InN, InP, InAs, InSb, and a mixture thereof, a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. A light emitting peak wavelength and FWHM (full width at half maximum) can be controlled by particle size, composition, or concentration gradient of the semiconductor nanocrystal.

The light conversion layer of the white LED according to the invention may be designed with various structures on the blue LED light source.

In one embodiment, for example, a light conversion layer 12 may include a mixed layer of a plurality of a green light emitting semiconductor nanocrystal 14 and a plurality of a red light emitting semiconductor nanocrystal 16 on a blue LED light source 10, as shown in FIG. 1. Both green light emitting semiconductor nanocrystals 14 and red light emitting semiconductor nanocrystals 16 are directly adjacent to the blue LED light source 10, and each nanocrystal may be considered a discrete and individual member, as illustrated in FIG. 1.

Figure 2:
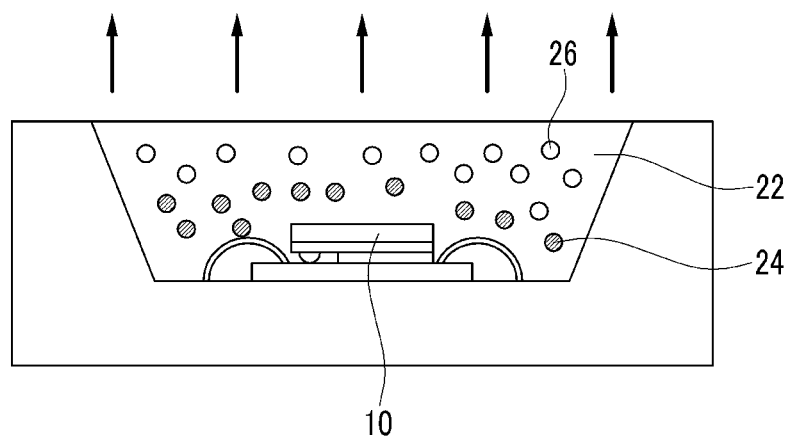

Further, in another embodiment shown in FIG. 2, a light conversion layer 22 may include a green light emitting semiconductor nanocrystal 24 on a blue LED light source 10, and a red light emitting semiconductor nanocrystal 26 thereon. The green light emitting semiconductor nanocrystal 24 is directly adjacent to the blue LED light source 10, and between the red light emitting semiconductor nanocrystal 26 and the blue LED light source 10, such that only the green light emitting semiconductor nanocrystal 24 is adjacent to the blue LED light source 10. Each nanocrystal may be considered a discrete and individual member, as illustrated in FIG. 1.

In an embodiment of a method of forming the light conversion layer 22 in FIG. 2, the green light emitting semiconductor nanocrystal 24 is directly coated on the blue LED light source 10, and then the red light emitting semiconductor nanocrystal 26 is coated on the green light emitting semiconductor nanocrystal 24 previously coated.

Figure 3:
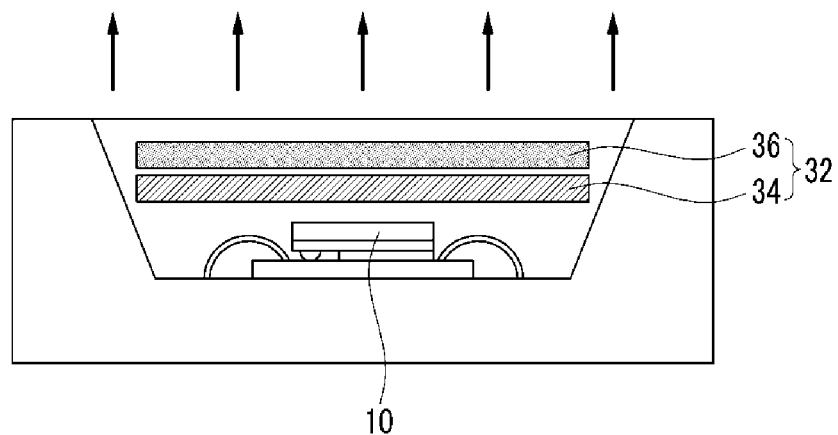

In another embodiment, as shown in FIG. 3, a light conversion layer 32 may include a red light emitting semiconductor nanocrystal layer 34 on a blue LED light source 10, and a green light emitting semiconductor nanocrystal layer 36 thereon. The red light emitting semiconductor nanocrystal layer 34 is directly adjacent to the blue LED light source 10, and between the green light emitting semiconductor nanocrystal layer 36 and the blue LED light source 10, such that only the red light emitting semiconductor nanocrystal layer 34 is adjacent to the blue LED light source 10. In alternative embodiments, the positions of the red light emitting semiconductor nanocrystal layer 34 and the green light emitting semiconductor nanocrystal layer 36 may be changed with each other. Specifically, a light conversion layer 32 including only the green light emitting semiconductor nanocrystal layer 36 directly on the LED light source 10, and the red light emitting semiconductor nanocrystal layer 34 thereon, may be provided. Although a light conversion layer 32 including only two deposited layers is shown in the drawing, a conversion layer 32 including a plurality of layers, e.g., more than two deposited layers, can be provided.

In an embodiment of a method of forming the light conversion layer 32 in FIG. 3, the red light emitting semiconductor nanocrystal layer 34 is coated directly on the blue LED light source 10, and then the green light emitting semiconductor nanocrystal layer 36 is coated on the red light emitting semiconductor nanocrystal layer 34 previously coated. Each of the red light emitting semiconductor nanocrystal layer 34 and the green light emitting semiconductor nanocrystal layer 36 may be considered a single unitary indivisible member, as illustrated in FIG. 3.

Figure 4:
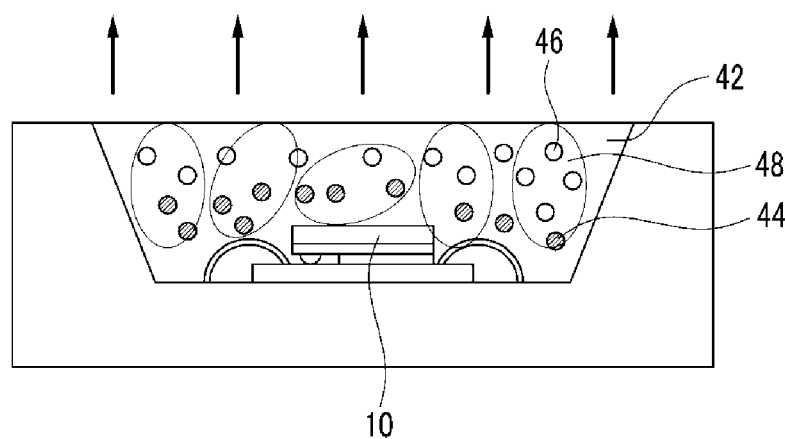

In another embodiment, as shown in FIG. 4, a light conversion layer 42 including a plurality of a composite particle 48 of green semiconductor nanocrystals 44 and red semiconductor nanocrystals 46 may be provided. A composite particle 48 is indicated by the ellipse or circle around a plurality of nanocrystals in FIG. 4. As illustrated in FIG. 4, the leftmost composite particle 48 is shown as including two green semiconductor nanocrystals 44 and two red semiconductor nanocrystals 46. The light conversion layer 42 includes both composite particles 48 and individual colored nanocrystals (e.g., green semiconductor nanocrystals 44 and red semiconductor nanocrystals 46) among the composite particles 48.

The white light emitting diode may be used as a backlight unit of a liquid crystal display device. An embodiment of a liquid crystal display device according to the invention includes a white light emitting diode having the above-described construction, and a liquid crystal panel including a color filter that realizes image using the white light generated by the white light emitting diode.

Figure 5:
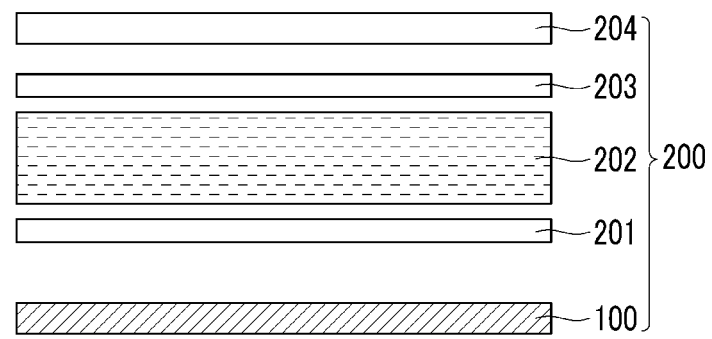
FIG. 5 is a schematic diagram of an embodiment of a liquid crystal display device, according to the invention.

FIG. 5 schematically shows an embodiment of a liquid display device, according to the invention.

Referring to FIG. 5, the liquid crystal display device includes a backlight unit 100, and a liquid crystal panel 200 that forms images of a predetermined color using the white light emitted from the backlight unit 100. The backlight unit 100 may include an embodiment of the above-described white light emitting diodes.

The liquid crystal panel 200 may include a first polarizer 201, a liquid crystal layer 202, a second polarizer 203, and a color filter 204, which are sequentially disposed relative to the backlight unit 100. The white light emitted from the backlight unit 100 is transmitted through the first polarizer 201, the liquid crystal layer 202, and the second polarizer 203, and the transmitted white light enters into the color filter 204 to form the images of a predetermined color. Between the backlight unit 100 and the liquid crystal panel 200, a diffusion plate (not shown) may be positioned.

Hereinafter, the embodiments of the white light emitting diodes and the liquid crystal display device, are illustrated in more detail with reference to examples. However, the following examples are embodiments and are not limiting of the invention.

PREPARATION EXAMPLE 1

Synthesis of Green Light Emitting Multi-Layered Semiconductor Nanocrystal 16 grams (g) of trioctylamine ("TOA"), 0.128 g of octadecylphosphonic acid, and 0.1 millimole (mmol) of cadmium oxide are simultaneously introduced into a 125 milliliter (mL) flask equipped with a reflux condenser, and the reaction temperature is controlled to about 300 Celsius (° C.) while agitating the reaction mixture. Separately, Se powder is dissolved in trioctylphosphine ("TOP") to prepare a Se-TOP complex solution with a Se concentration of about 2 moles (M). To the agitated reaction mixture, 2 mL of the 2M Se-TOP complex solution is rapidly injected, and the mixture is reacted for about 2 minutes. After the reaction is completed, the temperature of the reaction mixture is lowered to room temperature as soon as possible, a non-solvent ethanol is added thereto, and centrifugation is conducted. A supernatant of the solution excluding the centrifuged precipitate is discarded, and the precipitate is dispersed in toluene to synthesize a CdSe nanocrystal solution.

8 g of TOA, 0.1 g of oleic acid, and 0.1 mmol of zinc acetate are simultaneously introduced into a 125 mL flask equipped with a reflux condenser, and the reaction temperature is controlled to about 300° C. while agitating the reaction mixture. The above synthesized CdSe nanocrystal solution is added to the reaction mixture, and then 0.5 mL of a 0.8M S-TOP complex solution is slowly added thereto, the mixture is reacted for about 1 hour to grow ZnS nanocrystal on the surface of CdSe nanocrystal, and an alloy layer is formed by diffusion at the interface. After the reaction is completed, centrifugation is carried out by the same method as separating the CdSe nanocrystal, and then the precipitate is dispersed in toluene to synthesize multi-layered nanocrystal CdSe/ZnS.

On the surface of the CdSe/ZnS nanocrystal, CdZnS is formed again. 0.05 mmol of cadmium acetate, 0.1 mmol of zinc acetate, 0.43 g of oleic acid, and 8 g of TOA are introduced into a 125 mL flask equipped with a reflux condenser, and the reaction temperature is controlled to about 300° C. while agitating the reaction mixture, and then the above synthesized nanocrystal CdSe/ZnS is injected therein. Immediately, 0.08 mmol of octyl thiol mixed with 2 mL of TOA is slowly injected therein and reacted for about 1 hour to form nanocrystal with a CdSe/ZnS/CdZnS multi-layered structure. After the reaction is completed, the synthesized material is separated by centrifugation and dispersed in toluene.

PREPARATION EXAMPLE 2

Synthesis of Red Light Emitting Multi-Layered Semiconductor Nanocrystal 32 g of TOA, 1.8 g of oleic acid, and 1.6 mmol of cadmium oxide are simultaneously introduced into a 125 mL flask equipped with a reflux condenser, and the reaction temperature is controlled to about 300° C. while agitating the reaction mixture. 0.2 mL of the 2M Se-TOP complex solution synthesized in Example 1 is rapidly injected in the reactant, and after 1 minute 30 seconds, 0.8 mmol of octyl thiol mixed with 6 mL of TOA is slowly injected therein. After reaction for about 40 minutes, 16 mL of a separately synthesized zinc oleate complex solution is slowly injected.

The zinc oleate complex solution is synthesized by introducing 4 mmol of zinc acetate, 2.8 g of oleic acid, and 16 g of TOA into a 12 mL flask equipped with a reflux condenser, and controlling reaction temperature to about 200° C. while agitating the reaction mixture. After lowering the temperature to about 100° C. or less, the zinc oleate complex solution is injected. Immediately after completing the implanting of the zinc oleate complex solution, 6.4 mmol of octyl thiol complex solution mixed with 6 mL of TOA is slowly added thereto and the mixture is reacted for about 2 hours. Thereby, CdSe nanocrystal is produced, and then CdS nanocrystal is grown on the surface and ZnS is grown again, sequentially.

After the reaction is completed, the temperature of the reaction mixture is lowered to room temperature as soon as possible, and non-solvent ethanol is added thereto and centrifugation is conducted. A supernatant of the solution excluding the centrifuged precipitate is discarded, and the precipitate is dispersed in toluene to synthesize multi-layered nanocrystal CdSe/CdS/ZnS with a size of about 8 nm.

EXAMPLE 1

Manufacture of White Light Emitting Diode

To the green light emitting semiconductor nanocrystal synthesized in Preparation Example 1 and the red light emitting semiconductor nanocrystal synthesized in Preparation Example 2, a mixed solution of hexane and ethanol with a volume ratio of about 6:4 is added, and the mixture is centrifuged at about 6000 revolutions per minute (rpm) for about 10 minutes to obtain a precipitate. To the obtained precipitate, a chloroform solvent is added to prepare a solution of about 1 weight percent (wt %). As epoxy resin, SJ4500 A and SJ4500 B manufactured by Samjun chemical Inc. are mixed at a volume ratio of about 1:1 beforehand, and air bubbles are removed. 1 wt % of the green light emitting semiconductor nanocrystal, 1 wt % of the red light emitting semiconductor nanocrystal, 0.1 mL of the chloroform solution, and 0.1 mL of the epoxy a resin are mixed, and the mixture is agitated so as to be uniform and maintained under vacuum for about 1 hour to remove the chloroform solution. The prepared mixture of the green light emitting semiconductor nanocrystal, the red light emitting semiconductor nanocrystal, and the epoxy resin is coated on a lamp type blue light emitting diode of a cup shape in an amount of about 20 mL, and cured at about 100° C. for about 3 hours to prepare a light conversion layer.

After primarily preparing the blue light emitting diode and the light conversion layer according to the above methods, for molding into a lamp shape, only epoxy resin is introduced in a mold and primarily cured, and the blue light emitting diode including the primarily cured light conversion layer is cured again at about 100° C. for about 3 hours to manufacture a lamp shape light emitting diode.

COMPARATIVE EXAMPLE 1

Manufacture of White Light Emitting Diode

To the red light emitting semiconductor nanocrystal synthesized in Preparation Example 2, a mixed solution of hexane and ethanol with a volume ratio of 6:4 is added, and the mixture is centrifuged at about 6000 rpm for about 10 minutes to obtain a precipitate. A chloroform solvent is added to the obtained precipitate to prepare a solution of about 1 wt %. As epoxy resin, SJ4500 A and SJ4500 B manufactured by Samjun chemical Inc. is mixed at a volume ratio of about 1:1 volume ratio beforehand, and air bubbles are removed. 1 wt % of the red light emitting semiconductor nanocrystal, 0.1 mL of the chloroform solution and 0.1 mL of the epoxy a resin are mixed, and the mixture is agitated so as to be uniform and maintained under vacuum for about 1 hour in order to remove the chloroform solution. 0.05 g of TG-3540 green inorganic phosphor manufactured by Sarnoff corporation is added thereto, and then the obtained mixture is coated on a lamp type blue light emitting diode of a cup shape in an amount of about 20 mL, and cured at about 100° C. for about 3 hours to prepare a light conversion layer.

After primarily preparing the blue light emitting diode and the light conversion layer according to the above method, for molding into a lamp shape, only epoxy resin is introduced in a mold and primarily cured, and the blue light emitting diode including the primarily cured light conversion layer is cured again at about 100° C. for about 3 hours to manufacture a lamp shape light emitting diode.

COMPARATIVE EXAMPLE 2

Manufacture of White Light Emitting Diode

To the green light emitting semiconductor nanocrystal synthesized in Preparation Example 1, a mixed solution of hexane and ethanol with a volume ratio of about 6:4 is added and the mixture is centrifuged at about 6000 rpm for about 10 minutes to obtain a precipitate. A chloroform solution is added to the obtained precipitate to prepare a solution of about 1 wt %. As epoxy resin, SJ4500 A and SJ4500 B manufactured by Samjun chemical Inc. is mixed at a volume ratio of about 1:1 beforehand, and air bubbles are removed. 1 wt % of the green light emitting semiconductor nanocrystal, 0.1 mL of the chloroform solution, and 0.1 mL of the epoxy resin are mixed, and the mixture is agitated so as to be uniform and maintained under vacuum for about 1 hour to remove the chloroform solution. 0.1 g of Sr—Mg—$P_4O_{16}$ series red inorganic phosphor manufactured by Sarnoff corporation is added thereto, and then the obtained mixture is coated on a lamp type blue light emitting diode of a cup shape in an amount of about 20 mL, and cured at about 100° C. for about 3 hours to prepare a light conversion layer.

After primarily preparing the blue light emitting diode and the light conversion layer according to the above method, for molding into a lamp shape, only epoxy resin is introduced in a mold and primarily cured, and the blue light emitting diode including the primarily cured light conversion layer is cured again at about 100° C. for about 3 hours to manufacture a lamp shape light emitting diode.

COMPARATIVE EXAMPLE 3

0.05 g of TG-3540 green inorganic phosphor and 0.1 g of Sr—Mg—$P_4O_{16}$ series red inorganic phosphor manufactured by Sarnoff corporation are agitated with 0.1 mL of epoxy resin to uniformly mix them. The prepared mixture of the inorganic phosphor and epoxy resin is coated on a lamp type blue light emitting diode of a cup shape in an amount of about 20 mL, and cured at about 100° C. for about 3 hours to prepare a light conversion layer.

After primarily curing the blue light emitting diode and the light conversion layer according to the above method, for molding into a lamp shape, only epoxy resin is introduced in a mold and primarily cured, and the blue light emitting diode including the primarily cured light emission layer is cured again at about 100° C. for about 3 hours to manufacture a lamp shape light emitting diode.

In order to measure spectra of the light emitting diodes of Example 1 and Comparative Examples 1 to 3 under the same conditions, light emitting characteristics collected at an integrating sphere are measured using an ISP75 system to analyze light emitting spectra. Graphs showing light emitting spectrum illustrate light emitting peak wavelengths (and full width at half maximum) in nanometer on the x-axis, versus intensity (or brightness) in astronomical units (a.u.) on the y-axis.

Figure 6:
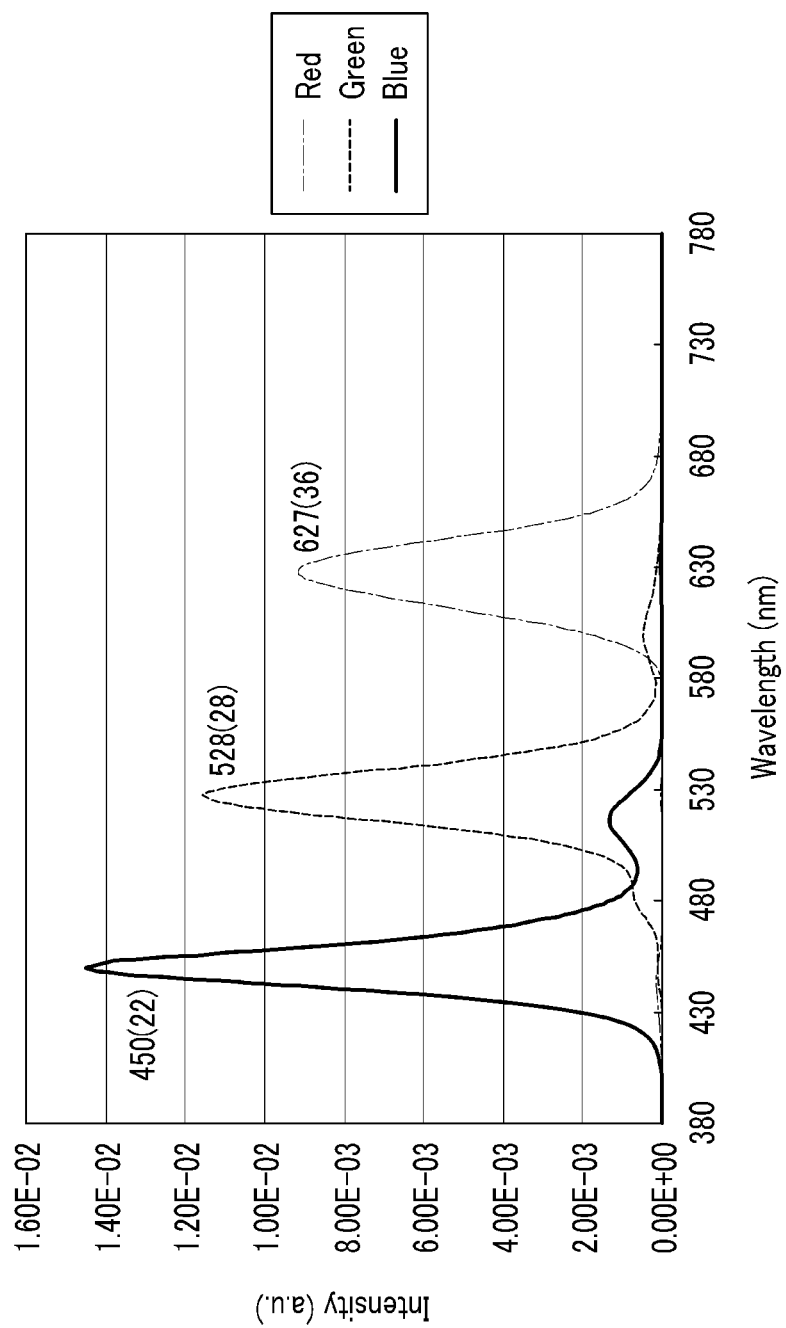
FIG. 6 shows an embodiment of a light emitting spectrum of the white light emitting diode according to Example 1.
Figure 7:
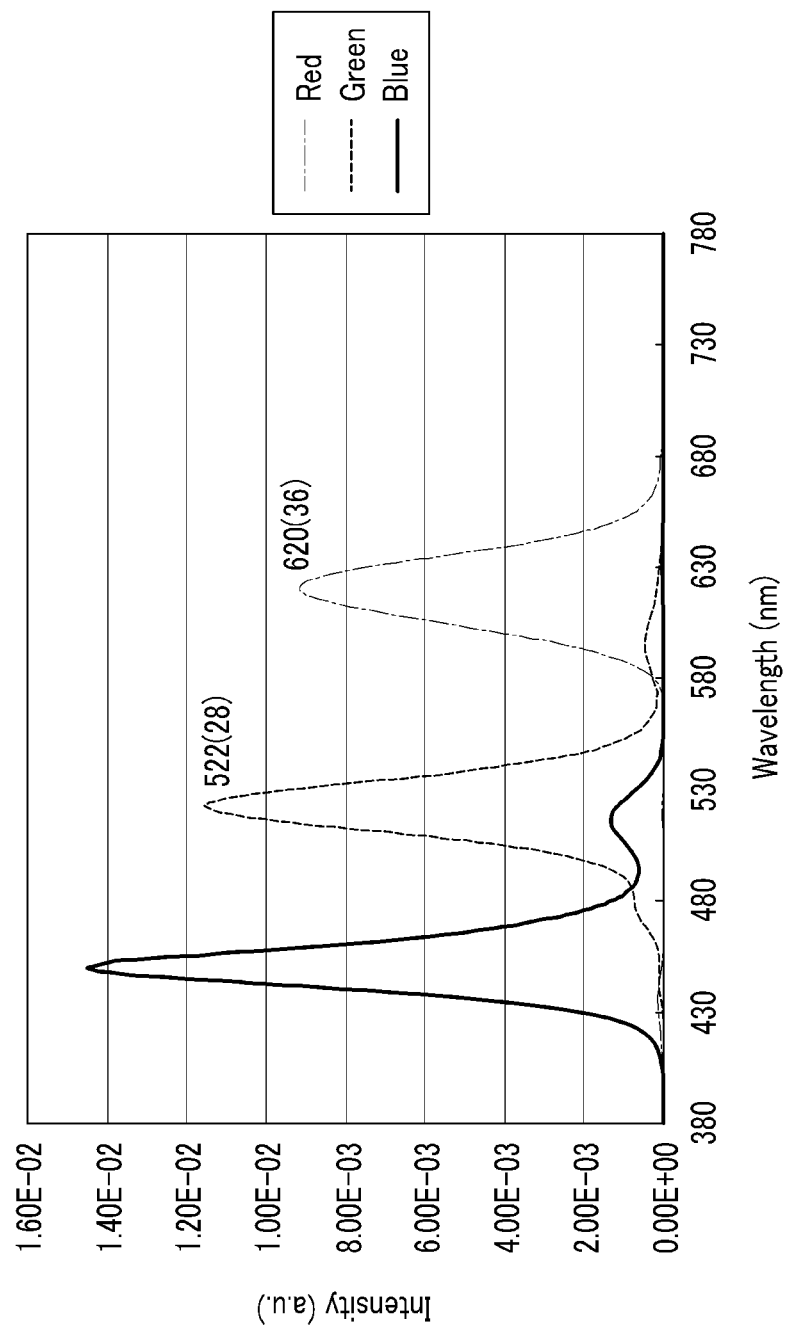
FIG. 7 shows an embodiment of a light emitting spectrum of the white light emitting diode according to Example 1, after color filter transmission.

The light emitting spectrum of the LED using the white light emitting semiconductor nanocrystal according to Example 1 is shown in FIG. 6. The light emitting spectrum after color filter transmission is shown in FIG. 7. In FIG. 6, the light emitting peak wavelengths and full width at half maximum (FWHM) of green and red light emitting spectra are respectively about 528 nm (about 28 nm) and about 626 nm (about 36 nm), and in FIG. 7, they are respectively about 522 nm (about 28 nm) and about 620 nm (about 36 nm) after transmission through a color filter of an LCD display, indicating that the light emitting peak wavelength or FWHM is not substantially changed after color filter transmission. FIG. 7 also shows that the ratio of the areas of light emitting spectra of the white emitting diode after each color filter transmission is about 1:0.94:0.84.

Figure 8:
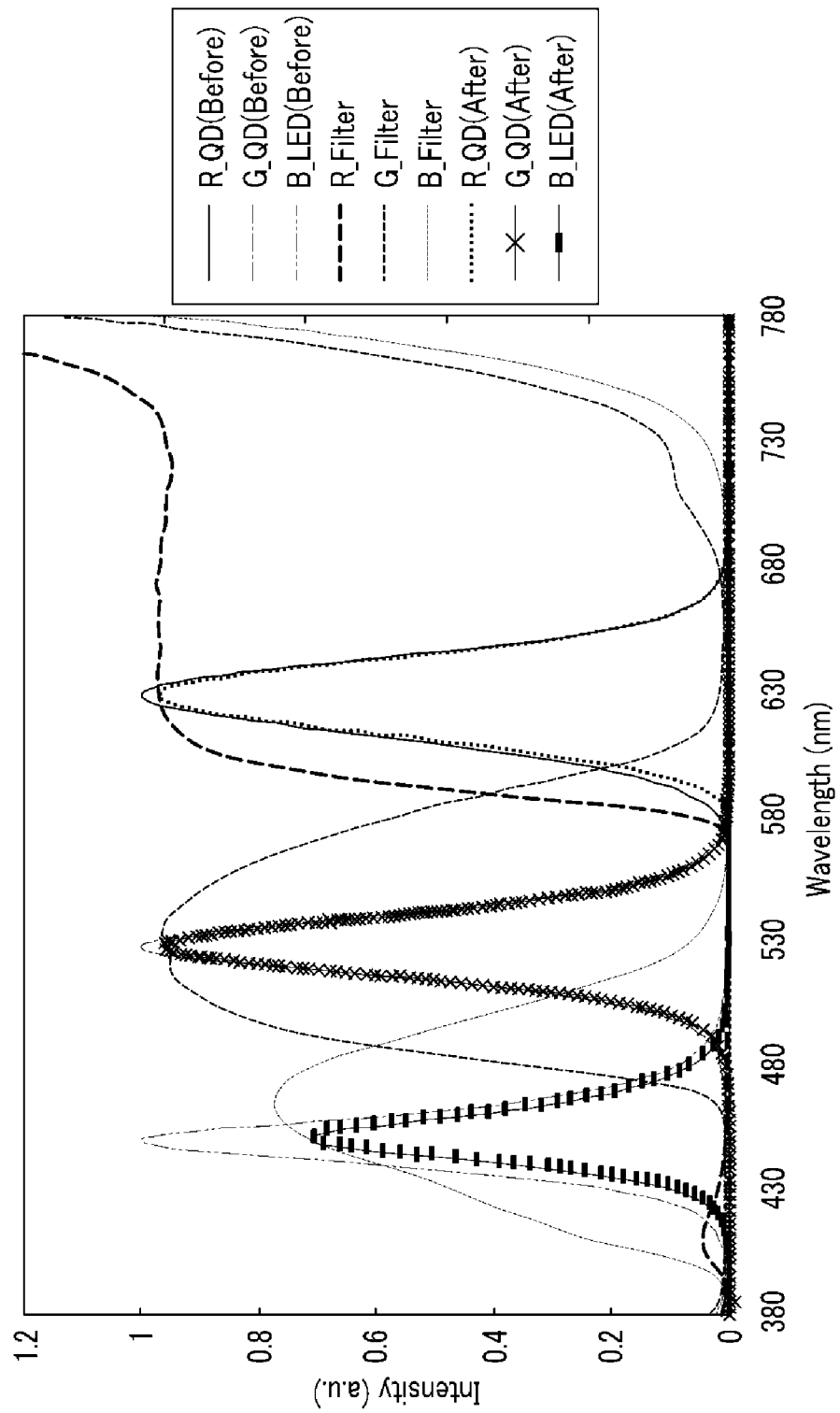
FIG. 8 shows an embodiment of a light emitting spectrum of the white light emitting diode according to Example 1 before and after transmitting respective color filters, and relative transmittance rates of blue, green, and red color filters.

In order to find out a color filter transmission rate of the white light emitting diode, light emitting spectra before and after transmitting respective color filters (R_QD, G_QD, B_QD), and relative transmittance rates of blue, green, and red color filters (R_Filter, G_Filter, B_Filter), are shown in FIG. 8. Referring to FIG. 8, it can be seen that each spectrum of the white light emitting diode according to Example 1 has substantially no difference in FWHM before and after transmitting respective the color filter. Further, the light emitting spectrum of the green light emitting semiconductor nanocrystal does not have a red color filter transmission part, while the light emitting spectrum of red light emitting semiconductor nanocrystal has a small green color filter transmission part.

Figure 9:
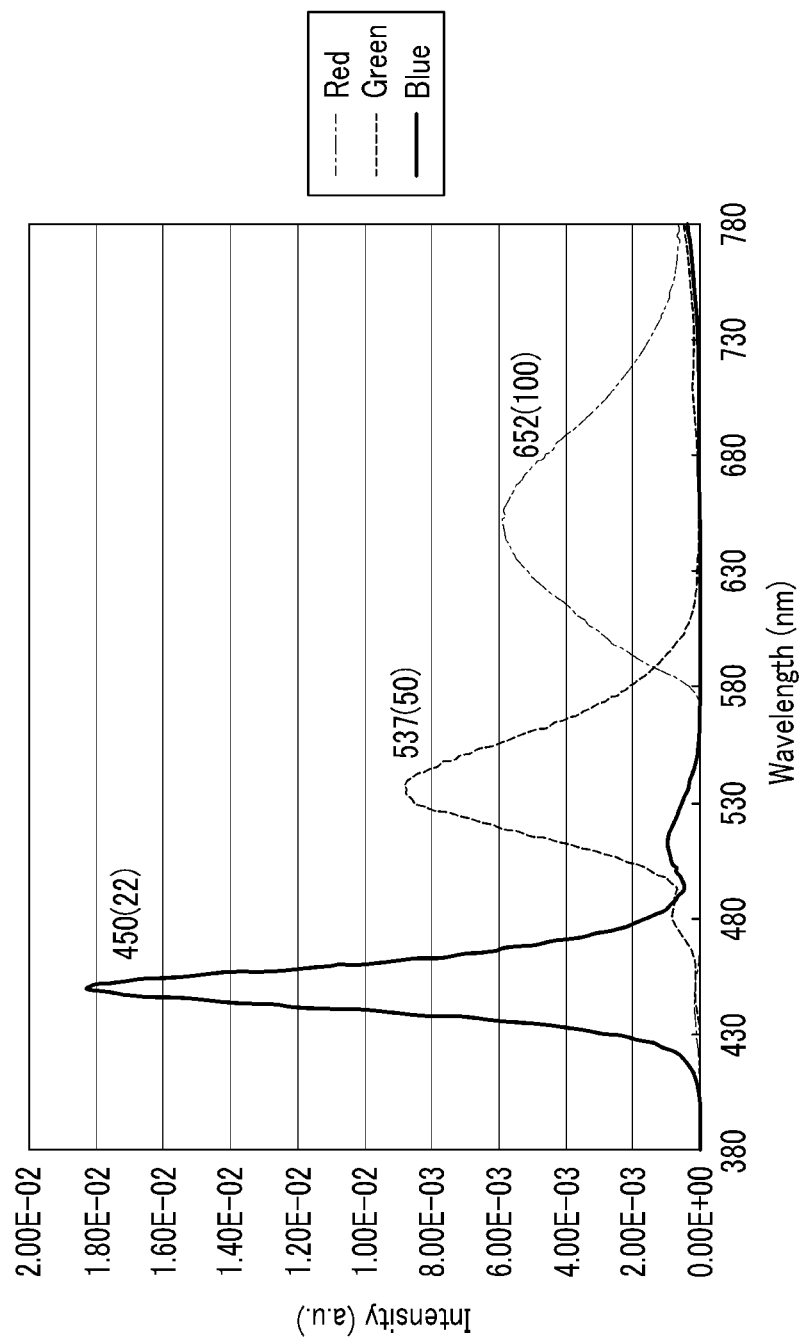
FIG. 9 shows an embodiment of a light emitting spectrum of the light emitting diode ("LED") using phosphor, according to Comparative Example 3.
Figure 10:
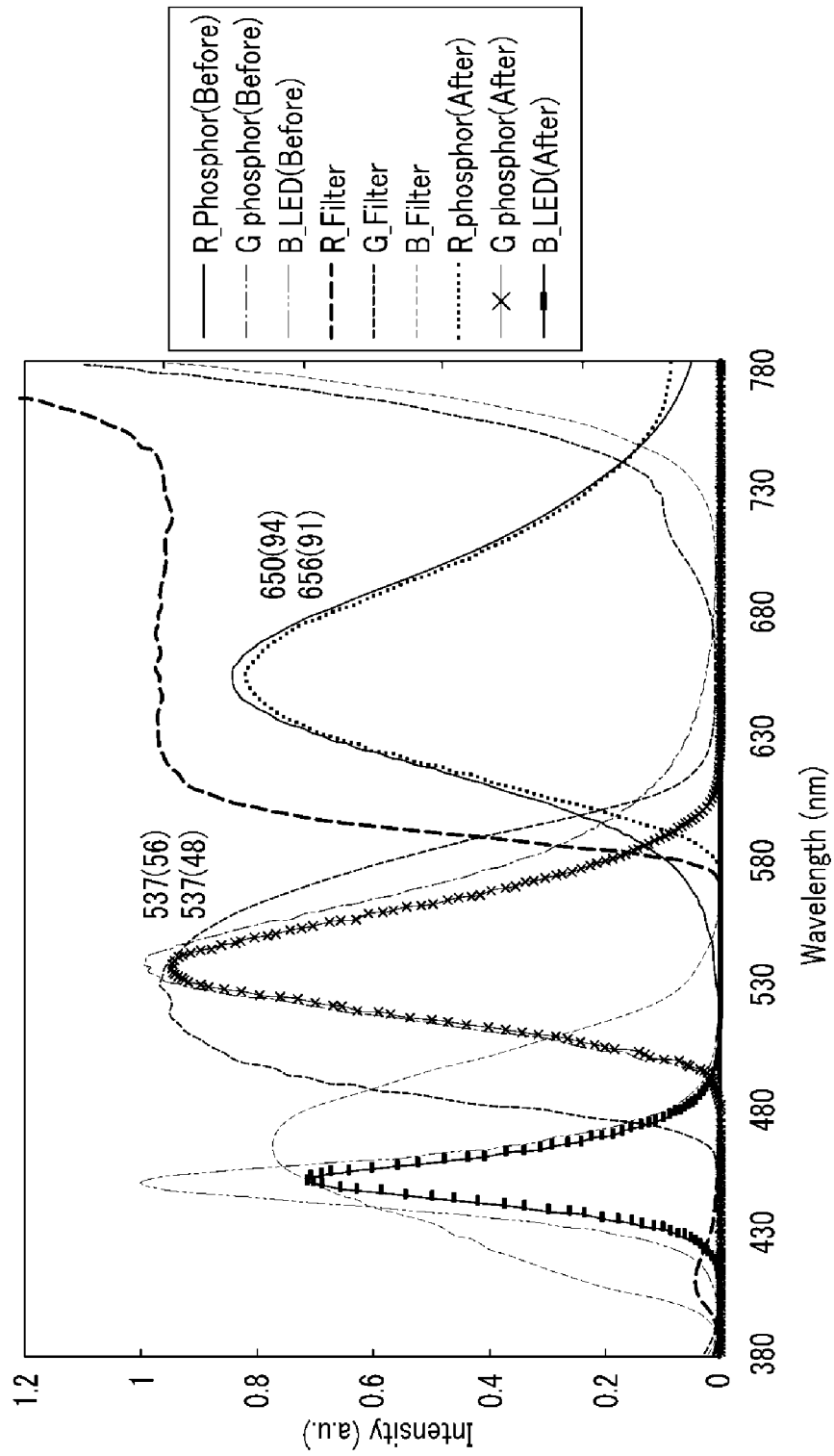
FIG. 10 shows an embodiment of a light emitting spectrum of the white light emitting diode, according to Comparative Example 3, before and after transmitting respective color filter and relative transmittance rates of blue, green, and red color filters.

The light emitting spectrum of an LED using the phosphor according to Comparative Example 3 is shown in FIG. 9. Referring to FIG. 9, it can be seen that FWHMs of green and red light emitting spectra are significantly wide. In order to determine a color filter transmission rate of the white light emitting diode according to Comparative Example 3, light emitting spectra before and after transmitting respective color filters (R_QD, G_QD, B_QD), and relative transmittance rates of blue, green, and red color filters (R_Filter, G_Filter, B_Filter) is also shown in FIG. 10. Referring to FIG. 10, it can be seen that each spectrum of the white light emitting diode according to Comparative Example 3 has many overlapping parts with each other, and a red color filter transmission part exists in the light emitting spectrum of the green phosphor, and a green color filter transmission part exists in the light emitting spectrum of the red phosphor.

Figure 11:
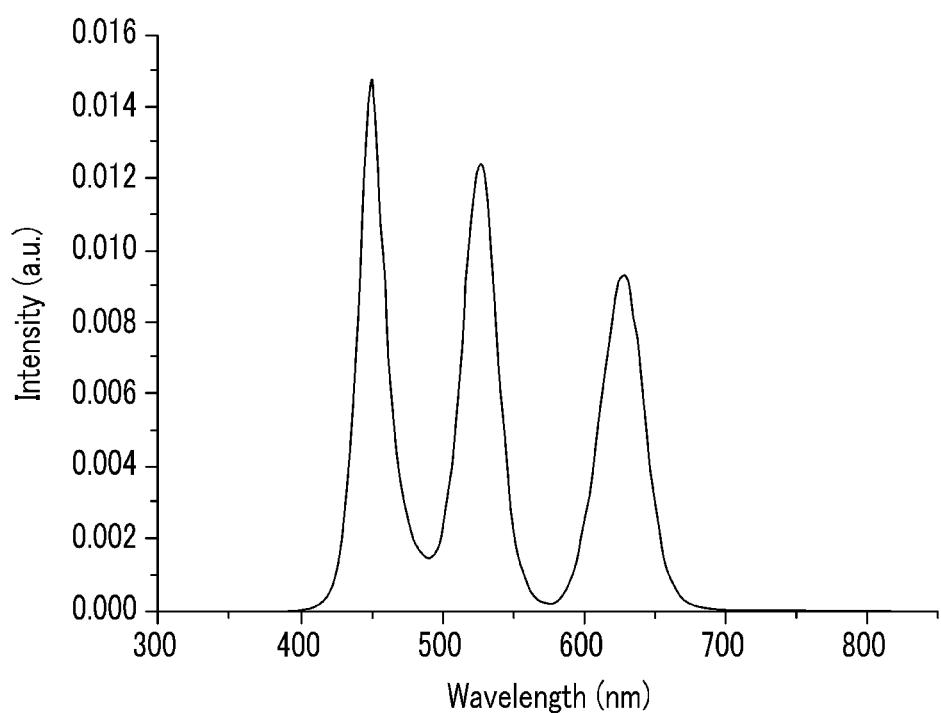
FIG. 11 shows an embodiment of a light emitting spectrum of the white light emitting diode of Example 1, while adjusting white color coordinates (x, y) of the backlight unit respectively to about 0.28±0.05 and about 0.29±0.05.

FIG. 11 shows a light emitting spectrum of the white light emitting diode of Example 1 while adjusting white color coordinates (x, y) of the backlight unit respectively to about 0.28±0.05 and about 0.29±0.05.

Using the spectra of the green semiconductor nanocrystal synthesized in Preparation Example 1, the red semiconductor nanocrystal synthesized in Preparation Example 2, and the green and red inorganic phosphor of Comparative Example 3, light emitting intensity is controlled so as to adjust the white color coordinate, and then color coordinates corresponding to red, green, and blue are calculated to obtain relative color reproducibility and relative luminance. The results are described in Table 1. In Table 1, at the bottom of each color coordinate, light emitting intensity for adjusting white color coordinate is described together.

TABLE 1

| | Red | Green | Blue | Color Coordinate | | | Relative color reproducibility (%) | Relative luminance (%) |
| --- | --- | --- | --- | --- | --- | --- | --- | --- |
| | | | | Red | Green | Blue | | |
| Ex. 1 | Semiconductor nanocrystal | Semiconductor nanocrystal | LED | (0.673, 0.308) 0.28 | (0.190, 0.707) 0.29 | (0.150, 0.057) 0.43 | 122 | 117 |
| Comp. Ex. 1 | Semiconductor nanocrystal | Phosphor | LED | (0.658, 0.318) 0.17 | (0.277, 0.655) 0.37 | (0.151, 0.046) 0.46 | 101 | 125 |
| Comp. Ex. 2 | Phosphor | Semiconductor nanocrystal | LED | (0.675, 0.305) 0.46 | (0.205, 0.697) 0.21 | (0.151, 0.056) 0.33 | 120 | 92 |
| Comp. Ex. 3 | Phosphor | Phosphor | LED | (0.659, 0.316) 0.31 | (0.282, 0.652) 0.30 | (0.151, 0.046) 0.39 | 100 | 100 |

From the above Table 1, it can be seen that the light emitting diode according to Example 1 prepared using green and red semiconductor nanocrystals has superior color reproducibility and relative luminance, compared to Comparative Examples 1 to 3 using green and/or red inorganic phosphor, respectively.

Figure 12:
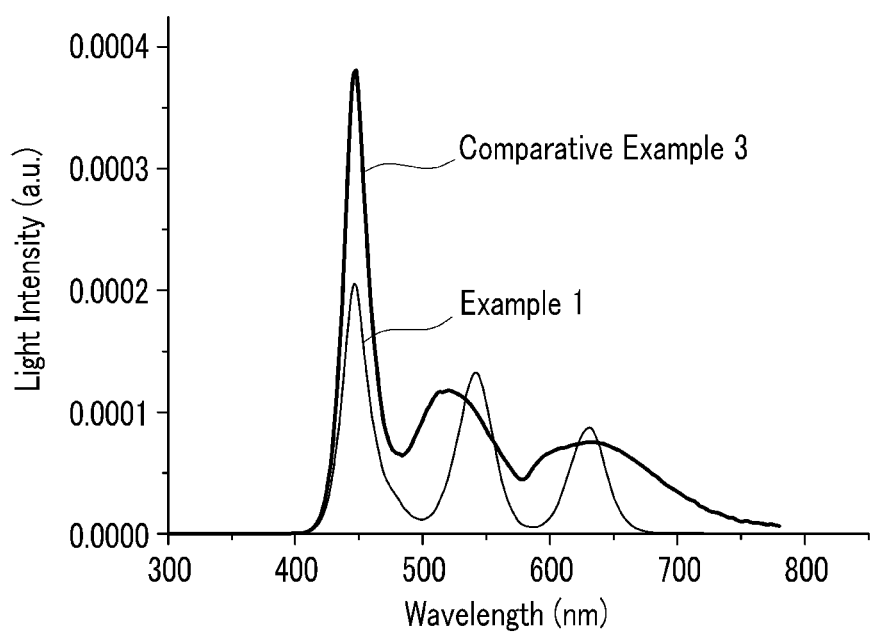
FIG. 12 shows an embodiment of a light emitting spectrum of the white light emitting diodes according to Example 1 and Comparative Example 3, after color filter transmission.
Figure 13:
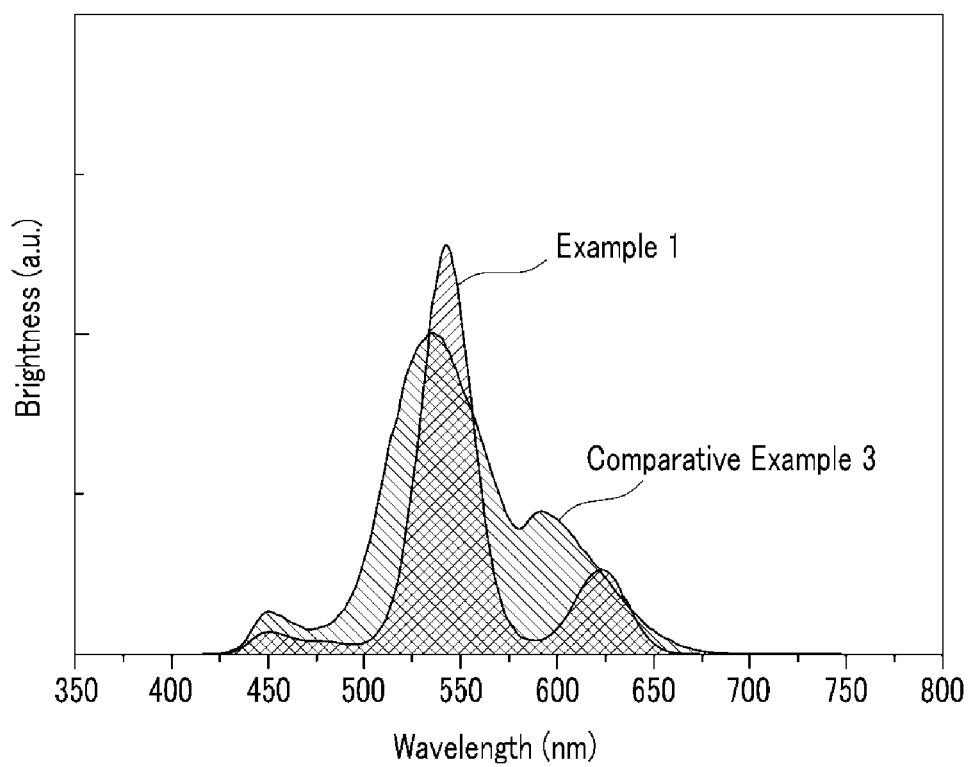
FIG. 13 shows an embodiment of a luminance spectrum of the white light emitting diodes according to Example 1 and Comparative Example 3, with reflecting photopic sensitivity.

FIG. 12 shows light emitting spectra of the white light emitting diodes according to Example 1 and Comparative Example 3 after color filter transmission, and FIG. 13 shows luminance spectra of the white light emitting diodes according to Example 1 and Comparative Example 3, while reflecting photopic sensitivity. As shown in FIG. 12, it can be seen that in the white light emitting diode according to Example 1, red, green, and blue light emitting wavelengths are not overlapped, while in the white light emitting diode according to Comparative Example 3, red, green, and blue light emitting wavelengths are overlapped with each other.

Also, as shown in FIG. 13 which reflects photopic sensitivity, a semiconductor nanocrystal included in Example 1, having a relatively narrow light emitting spectrum can maintain the visibility of the red spectrum region to be high, thus increasing luminance. If light emitting peak wavelength of a semiconductor nanocrystal is changed variously in order to maintain the characteristic more optimally, it appears that red and green light emitting peak wavelengths of about 630 nm and about 530 nm, respectively, are most effective in terms of color reproducibility and luminance.

Color reproducibility and relative luminance of semiconductor nanocrystal according to light emitting peak wavelength are measured and described in the following Table 2.

TABLE 2

| Red | Green | Blue | Red color coordinate | Green color coordinate | Blue color coordinate | Color reproducibility (%) | Relative luminance (%) |
| --- | --- | --- | --- | --- | --- | --- | --- |
| Semiconductor nanocrystal 630 nm | Semiconductor nanocrystal 530 nm | LED | (0.673, 0.308) 0.28 | (0.190, 0.707) 0.29 | (0.150, 0.057) 0.43 | 122 | 118 |
| Semiconductor nanocrystal 640 nm | Semiconductor nanocrystal 530 nm | LED | (0.686, 0.296) 0.33 | (0.178, 0.717) 0.27 | (0.150, 0.058) 0.4 | 137 | 108 |
| Semiconductor nanocrystal 630 nm | Semiconductor nanocrystal 540 nm | LED | (0.671, 0.307) 0.25 | (0.239, 0.691) 0.29 | (0.152, 0.045) 0.46 | 115 | 120 |
| Semiconductor nanocrystal 640 nm | Semiconductor nanocrystal 540 nm | LED | (0.683, 0.295) 0.29 | (0.231, 0.699) 0.28 | (0.152, 0.045) 0.43 | 120 | 113 |
| Semiconductor nanocrystal 620 nm | Semiconductor nanocrystal 530 nm | LED | (0.658, 0.323) 0.25 | (0.212, 0.690) 0.29 | (0.150, 0.056) 0.46 | 112 | 118 |

As shown in the above Table 2, when the light emitting peak wavelengths of green and red semiconductor nanocrystals are in the range of about 530 nm to about 540 nm, and about 620 nm to about 640 nm, respectively, both color reproducibility and relative luminance are excellent.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. A liquid crystal display device comprising:
 a white light emitting diode generating white light; and
 a color filter which realizes images using the white light generated by the white light emitting diode,
 the white light emitting diode including:
  a blue light emitting diode light source generating light; and
  a light conversion layer which converts incident light from the blue light emitting diode light source to the white light, and the light conversion layer including:
   a green light emitting member comprising green light emitting semiconductor nanocrystal; and a red light emitting member comprising red light emitting semiconductor nanocrystal,
wherein the green and red light emitting members exclude inorganic phosphor,
wherein
a light emitting peak wavelength of the green light emitting semiconductor nanocrystal is about 520 nanometer or more, a light emitting peak wavelength of the red semiconductor nanocrystal is about 610 nanometer or more, and full width at half maximum of light emitting peaks of the green and red light emitting semiconductor nanocrystals are about 45 nanometer or less,
a green color filter transmission rate of a light emitting spectrum of the green light emitting semiconductor nanocrystal is about 90% or more, and a red color filter transmission rate of the light emitting spectrum of the green light emitting semiconductor nanocrystal is less than about 10%, and
a red color filter transmission rate of a light emitting spectrum of the red light emitting semiconductor nanocrystal is about 90% or more, and a green color filter transmission rate of the light emitting spectrum of the red light emitting semiconductor nanocrystal is less than about 10%.

2. The liquid crystal display device of claim 1, wherein
a ratio of an overlapping area (S), to a total area ($A_G$) of the light emitting spectrum of the green light emitting semiconductor nanocrystal ($S/A_G$), and
a ratio of the overlapping area (S), to a total area ($A_R$) of the light emitting spectrum of the red light emitting semiconductor nanocrystal ($S/A_R$),
is about 10% or less.

3. The liquid crystal display device of claim 1, wherein
a ratio of an overlapping area (S), to a total area ($A_G$) of the light emitting spectrum of the green light emitting semiconductor nanocrystal ($S/(A_G)$; and
a ratio of an overlapping area (S), to a total area ($A_R$) of the light emitting spectrum of the red light emitting semiconductor nanocrystal ($S/A_R$)
is about 7% or less.

4. The liquid crystal display device of claim 1, wherein
a ratio of an overlapping area (S) to a total area ($A_G$) of the light emitting spectrum of the green light emitting semiconductor nanocrystal ($S/A_G$); and
a ratio of an overlapping area (S) to a total area ($A_R$) of the light emitting spectrum of the red light emitting semiconductor nanocrystal ($S/A_R$)
is about 5% or less.

5. The liquid crystal display device of claim 1, wherein the full width at half maximums of the light emitting peaks of the green and the red light emitting semiconductor nanocrystals, are about 40 nanometer or less.

6. The liquid crystal display device of claim 1, wherein
the blue light emitting diode light source has a light emitting peak wavelength of about 440 nanometer to about 470 nanometer,
the light emitting peak wavelength of the green light emitting semiconductor nanocrystal is about 520 nanometer to about 550 nanometer, and
the light emitting peak wavelength of the red light emitting semiconductor nanocrystal is about 610 nanometer to about 640 nanometer.

7. The liquid crystal display device of claim 1, wherein
the blue light emitting diode light source has a relative light emitting intensity of about 0.43±0.05,
the green light emitting semiconductor nanocrystal has a relative light emitting intensity of about 0.27±0.05, and
the red light emitting semiconductor nanocrystal has a relative light emitting intensity of about 0.28±0.05.

8. The liquid crystal display device of claim 1, wherein the white light emitting diode has color coordinates including an x-coordinate of about 0.24±0.05, and a y-coordinate of about 0.21±0.05.

9. The liquid crystal display device of claim 1, wherein the white light emitting diode has a color temperature of about 4,000 Kelvin to about 100,000 Kelvin.

10. The liquid crystal display device of claim 1, wherein
the green color filter transmission rate of the light emitting spectrum of the green light emitting semiconductor nanocrystal is about 95% or more of a maximum transmittance rate of a green color filter, and the red color filter transmission rate of the light emitting spectrum of the green light emitting semiconductor nanocrystal is less than about 5% of a maximum transmittance rate of a red color filter; and
the red color filter transmission rate of the light emitting spectrum of the red light emitting semiconductor nanocrystal is about 95% or more of the maximum transmittance rate of the red color filter, and the green color filter transmission rate of the red light emitting semiconductor nanocrystal is less than about 5% of the maximum transmittance rate of the green color filter.

11. The liquid crystal display device of claim 1, wherein a ratio of light emitting intensities of blue, green, and red light emitting spectra of the white emitting diode after color filter transmission is in the range of about 1:0.9±0.1:0.8±0.1.

12. A white light emitting diode including:
a blue light emitting diode light source generating light; and
a light conversion layer which converts incident light from the light emitting diode light source into white light,
the light conversion layer including a green light emitting member comprising green light emitting semiconductor nanocrystal, and a red light emitting member comprising red light emitting semiconductor nanocrystal, the green and red light emitting members excluding inorganic phosphor,
wherein
a light emitting peak wavelength of the green light emitting semiconductor nanocrystal is about 520 nanometer or more, a light emitting peak wavelength of the red semiconductor nanocrystal is about 610 nanometer or more, and full width at half maximum of light emitting peaks of the green and red light emitting semiconductor nanocrystals are about 45 nanometer or less, and
the white light emitting diode has color reproducibility of about 90% or more, compared to National Television System Committee (NTSC) color coordinate of International Commission on Illumination (CIE) 1931 coordinates.

13. The white light emitting diode of claim 12, wherein full width at half maximums of the light emitting peaks of the green and red light emitting semiconductor nanocrystals are about 40 nm or less.

14. The white light emitting diode of claim 12, wherein
the blue light emitting diode light source has a light emitting peak wavelength of about 440 nanometer to about 470 nanometer,
the light emitting peak wavelength of the green light emitting semiconductor nanocrystal is about 520 nanometer to about 550 nanometer, and the light emitting peak wavelength of the red light emitting semiconductor nanocrystal is about 620 nanometer to about 640 nanometer.

15. The white light emitting diode of claim 12, wherein
the blue light emitting diode light source has a relative light emitting intensity of about 0.43±0.05,
the green light emitting semiconductor nanocrystal has a relative light emitting intensity of about 0.27±0.05, and
the red light emitting semiconductor nanocrystal has a relative light emitting intensity of about 0.28±0.05.

16. The white light emitting diode of claim 12, wherein the white light emitting diode has color coordinates including an x-coordinate of about 0.24±0.05 and a y-coordinate of about 0.21±0.05.

17. The white light emitting diode of claim 12, wherein the white light emitting diode has a color temperature of about 9500 Kelvin to about 100,000 Kelvin.

18. A liquid crystal display device comprises:
a white light emitting diode, and
a liquid crystal panel including a color filter which realizes images using white light generated by the white light emitting diode
wherein the white light emitting diode includes:
  a blue light emitting diode light source generating light; and
  a light conversion layer which converts incident light from the light emitting diode light source into white light, the light conversion layer including:
    a green light emitting member comprising green light emitting semiconductor nanocrystal, and a red light emitting member comprising red light emitting semiconductor nanocrystal, the green and red light emitting members excluding inorganic phosphor,
  wherein
  a light emitting peak wavelength of the green light emitting semiconductor nanocrystal is about 520 nanometer or more, a light emitting peak wavelength of the red semiconductor nanocrystal is about 610 nanometer or more, and full width at half maximum of light emitting peaks of the green and red light emitting semiconductor nanocrystals are about 45 nanometer or less, and
  the white light emitting diode has color reproducibility of about 90% or more, compared to National Television System Committee (NTSC) color coordinate of International Commission on Illumination (CIE) 1931 coordinates.

19. The liquid crystal display device of claim 18, wherein a ratio of light emitting intensities of blue, green, and red light emitting spectra of the white emitting diode after color filter transmission is in the range of about 1:0.9±0.1:0.8±0.1.

20. A method of forming a backlight unit of a liquid crystal display, the method comprising:
disposing a light conversion layer overlapping a blue light emitting diode light source to form a white light emitting diode generating white light, the light conversion layer configured to convert incident light from the blue light emitting diode light source into the white light;
the disposing a light conversion layer including:
  disposing a green light emitting member comprising green light emitting semiconductor nanocrystal, on the blue light emitting diode light source; and
  disposing a red light emitting member comprising red light emitting semiconductor nanocrystal, on the blue light emitting diode light source,
  the green and red light emitting members excluding inorganic phosphor;
wherein
a light emitting peak wavelength of the green light emitting semiconductor nanocrystal is about 520 nanometer or more, a light emitting peak wavelength of the red semiconductor nanocrystal is about 610 nanometer or more, and full width at half maximum of light emitting peaks of the green and red light emitting semiconductor nanocrystals are about 45 nanometer or less;
a green color filter transmission rate of a light emitting spectrum of the green light emitting semiconductor nanocrystal is about 90% or more, and a red color filter transmission rate of the light emitting spectrum of the green light emitting semiconductor nanocrystal is less than about 10%, and
a red color filter transmission rate of a light emitting spectrum of the red light emitting semiconductor nanocrystal is about 90% or more, and a green color filter transmission rate of the light emitting spectrum of the red light emitting semiconductor nanocrystal is less than about 10%.

21. The method of forming a backlight unit of claim 20, wherein the disposing a light conversion layer further includes disposing substantially an entire of one of the green light emitting semiconductor nanocrystal and the red light emitting semiconductor nanocrystal adjacent to the blue light emitting diode light source, such that the one directly disposed light emitting semiconductor nanocrystal is between the other emitting semiconductor nanocrystal and the blue light emitting diode light source.

22. The method of forming a backlight unit of claim 20, wherein the disposing a light conversion layer further includes:
forming a plurality of a composite particle, the composite particle collectively including a plurality of the green light emitting semiconductor nanocrystal and a plurality of the red light emitting semiconductor nanocrystal, on the blue light emitting diode light source.

* * * * *